US006284366B1

(12) United States Patent
König et al.

(10) Patent No.: US 6,284,366 B1
(45) Date of Patent: Sep. 4, 2001

(54) CUTTING TOOL AND METHOD OF MAKING SAME

(75) Inventors: Udo König, Essen; Ingolf Endler, Coswig; Albrecht Leonhard, Dresden, all of (DE)

(73) Assignee: Widia GmbH, Essen (DE)

( * ) Notice: Subject to any disclaimer, the term of this patent is extended or adjusted under 35 U.S.C. 154(b) by 0 days.

(21) Appl. No.: 09/323,570

(22) Filed: Jun. 1, 1999

(30) Foreign Application Priority Data

Jun. 8, 1998 (DE) .............................. 198 25 572

(51) Int. Cl.⁷ ........................................... B32B 9/00
(52) U.S. Cl. .................. 428/336; 51/307; 51/309; 428/472; 428/698; 428/701; 428/702; 428/704
(58) Field of Search .................. 428/648, 704, 428/472, 469, 336, 216, 701, 702; 51/307, 309

(56) References Cited

U.S. PATENT DOCUMENTS

| | | | | |
|---|---|---|---|---|
| 4,054,426 | * | 10/1977 | White | 51/309 |
| 4,324,803 | * | 4/1982 | Bergmann et al. | 428/698 |
| 4,788,932 | | 12/1988 | Kullman et al. | |
| 4,820,591 | * | 4/1989 | Ramanarayanan | 428/628 |
| 4,975,340 | * | 12/1990 | Suhr et al. | 428/704 |
| 5,268,216 | * | 12/1993 | Keem et al. | 428/698 |
| 5,965,253 | * | 10/1999 | Rechberger et al. | 428/336 |

FOREIGN PATENT DOCUMENTS

| | | |
|---|---|---|
| 24 15 255 | 10/1975 | (DE) . |
| 31 52 742 C2 | 2/1981 | (DE) . |
| 202 898 | 1/1982 | (DE) . |
| 35 16 933 | 11/1987 | (DE) . |
| 38 34 356 A1 | 10/1988 | (DE) . |
| 44 13 785 C2 | 4/1994 | (DE) . |
| 195 11 829 A1 | 3/1995 | (DE) . |
| 0 534 905 | 3/1993 | (EP) . |
| 0 852 167 A1 | 7/1998 | (EP) . |

OTHER PUBLICATIONS

E. Tschanger, Berlin, Article No. 22/1958, Chemical Journal.
Lee Et Al Article, Ohio State University, Gaseous Sulfidation.
English abstract of CH 562883.*

* cited by examiner

*Primary Examiner*—Archene Turner
(74) *Attorney, Agent, or Firm*—Herbert Dubno

(57) ABSTRACT

A tool having a substrate and at least as a sole layer or the outermost layer, a coating of the molybdenum sulfide containing 0.5 to 6 atomic % chlorine.

14 Claims, 1 Drawing Sheet

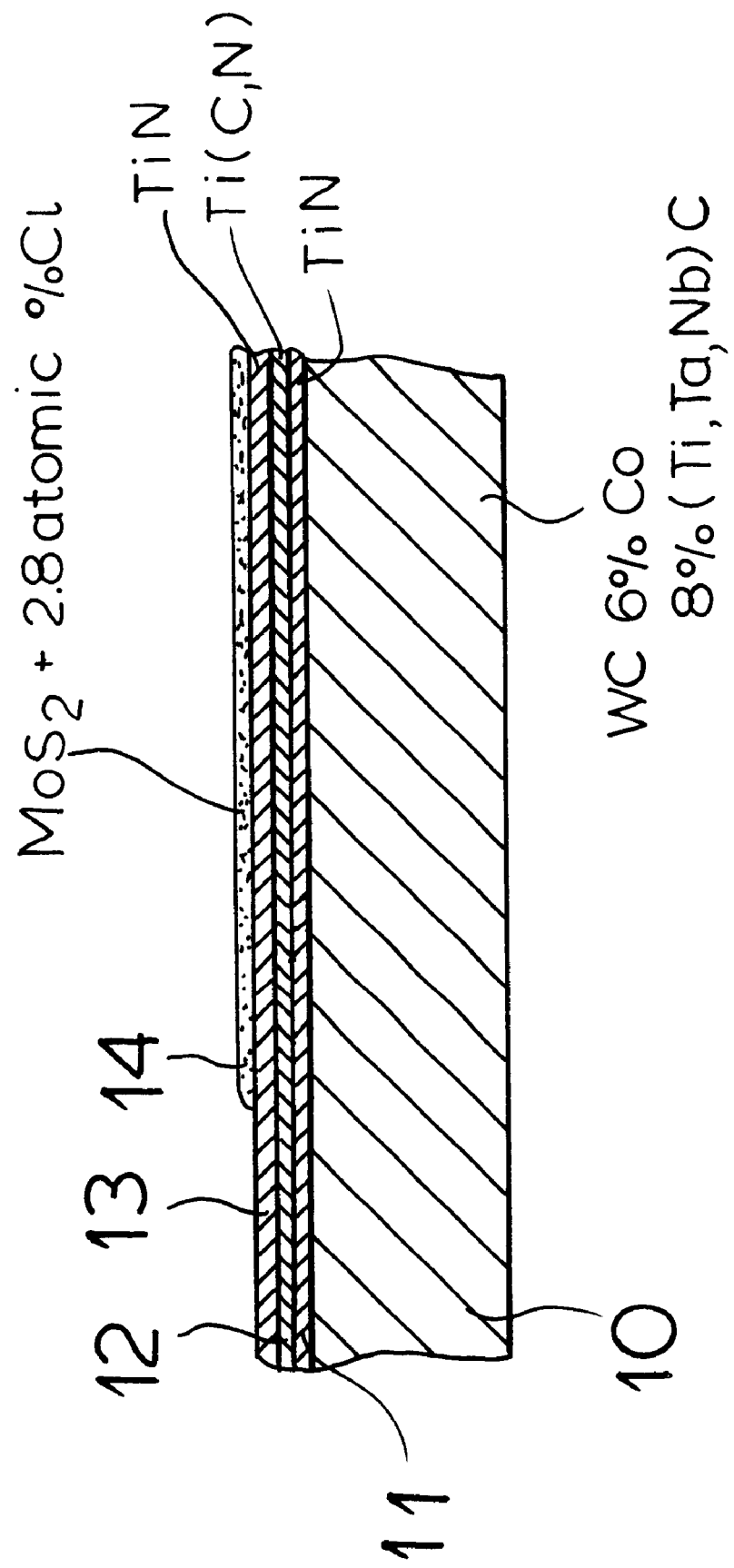

CUTTING TOOL AND METHOD OF MAKING SAME

FIELD OF THE INVENTION

The present invention relates to a cutting tool of the type in which a substrate, usually of a hard metal, cermet, ceramic or steel, is coated with at least one layer and in which the outermost layer of the coating is a molybdenum sulfide layer. The invention also relates to a method of making such a tool with an outermost molybdenum sulfide layer.

BACKGROUND OF THE INVENTION

The coating of substrate bodies of hard metal, cermets, ceramics or steel with hard-facing and wear-reducing layers of hard materials, mixtures of hard materials or ceramics, is known in the production of cutting tools. The coatings can be carbides, nitrides, carbonitrides, oxycarbonitrides, oxides and/or borides of an element from Groups IVa to VIa of the Periodic Table. Examples of such wear-reducing materials include TiC, TiN, Ti(C,N) and ceramics like $Al_2O_3$ and $ZrO_2$. At high cutting speeds and/or large cutting cross sections, the high temperatures at the tool/workpiece interface give rise to enhanced wear, especially with workpieces which are difficult to machine, and ultimately to breakage of the tool. To minimize the temperatures which develop in machining of such workpieces, i.e. at the chip-forming region, coolants and lubricants can be used which are environmentally unsound and can produce noxious and toxic waste and which are costly because of the cost of the coolant and/or lubricant.

It is known to provide solid dry lubricant films, for example of molybdenum disulfide (DE-A 24 15 25)and to improve the adhesion of such layers to the substrate by first sputtering the base layer of $MoS_2$ or $WS_2$ onto the substrate with a thickness of 1 to 2 μm a and then applying the dry lubricant film of $MOS_2$ or WS2.

In DD 202 898 it has been proposed to sputter layers of molybdenum disulfide or the like on tools used for chip removal machining, punching, drawing or like shaping, the layer thickness being in the nm range. In these systems, a substrate body is provided with a hard layer by sputtering of a coating which has a hexagonal lattice structure. EP 0 534 905 A2 proposes a plasma vapor deposition (PVD) coating of chip removing tools with, for example molybdenum disulfide.

The cathodic sputtering of molybdenum disulfide layers on a substrate body or on hard material coating previously applied to the substrate body can provide $MOS_2$ crystallites with an unsatisfactory orientation. To keep the friction coefficient of such a layer as small as possible, the hexagonal lattice component of the $MOS_2$ layer should be so oriented that the hexagonal planes run parallel to the surface and the axes of the hexagonal lattice structures run perpendicular or normal to the surface. This has been found to improve the oxygen resistance of the layer.

DE 35 16 933 A1 proposes that the ratio of the water vapor partial pressure for such coating be less than $10^{-7}$ millibar/1.6 $mgm^{-2}s^{-1}$ which can be attained in high cost.

Apart from the fact that the PVD process requires pure gas atmospheres, i.e. gas atmospheres free from foreign substances, a drawback of the PVD process is that a directed particle stream must pass from the target source to the substrate, thereby requiring that the substrate be rotated about three axes for uniform coating.

OBJECTS OF THE INVENTION

It is the principal object of the present invention to provide a tool of the aforedescribed type which has an improved wear resistance, a wear layer which has better adhesion to the sputter or layers of hard materials on the substrate and improved oxidation resistance.

Another object of the invention is to provide a method of forming such a workpiece and, in particular, a method of coating a molybdenum disulfide layer onto a substrate or a substrate body coated with other layers such that complex apparatus and mechanisms can be avoided and especially well adhering oxidation resistant molybdenum disulfide layers will be deposited.

SUMMARY OF THE INVENTION

These objects and others which will become apparent hereinafter are attained, in accordance with the invention in a tool which comprises:

a substrate forming a tool body and composed of at least one material selected from the group which consists of hard metals, cermets, ceramics and steel; and a coating comprised of at least one layer on the substrate and including an outermost molybdenum sulfide layer, the outermost molybdenum sulfide layer being composed predominantly of molybdenum sulfide and containing chlorine in an amount of 0.5 to 6 atomic percent.

The method of applying a molybdenum sulfide layer to a substrate can comprise the steps of:

(a) depositing molybdenum sulfide on a substrate by chemical vapor deposition from a gas mixture containing molybdenum chloride, hydrogen sulfide, an inert gas and hydrogen; and (b) controlling the hydrogen content of the gas mixture so that it lies within the range of 1 volume percent to 90 volume percent.

The single layer on the substrate body or the outermost layer when a plurality of layers are provided should thus have according to the invention a chlorine content of 0.5 to 6 atomic %, preferably 0.5 to 3 atomic %. The molybdenum sulfide in the single layer or the outermost layer can have a hexagonal lattice structure and preferably has its hexagonal lattice cells with axes that are normal (perpendicular) to the plane of the hexagonal cell and thus to the tool surface. According to a further feature of the invention the volumetric proportion of the molybdenum sulfide with the hexagonal lattice structure should be greater than 70%. The balance of this layer can consist of rhombohedral molybdenum disulfide and/or $MO_2S_3$.

It is surprising that a chlorine content in the aforedescribed range can significantly improve the wear resistance of the tool.

The hexagonal cells of the molybdenum sulfide layer should lie in planes parallel to the substrate surface and the axes of these hexagonal cells should be perpendicular to the surface, to minimize the friction coefficient of the single molybdenum sulfide layer or the outermost molybdenum sulfide layer and simultaneously enhance the oxidation resistance.

The applied molybdenum sulfide layer can either be completely in the form of the hexagonal phase of $MoS_2$ or partially composed of rhombohedral molybdenum disulfide and/or $MO_2S_3$, with the preponderance bring the hexagonal molybdenum disulfide. Apart from the chlorine inclusions in the single layer or the outermost layer, inert gas, for example, argon can be included in small amounts up to two atomic percent.

Preferably the thickness of the exclusive outer layer or the outermost layer of a plurality of such layers is selected to be between 0.2 μm to 3 μm and especially about 2 μm.

In order to improve upon the resistance of the surface to frictional abrasion of the relatively soft $MoS_2$ layer a thin metallic protective film can be formed on the single or outermost $MoS_2$ layer in a thickness of at most 0.3 μm and preferably composed of molybdenum carbide, titanium carbide, titanium carbonitride or zirconium carbonitride.

It is within the scope of the present invention to make the single or outermost molybdenum disulfide layer itself a multilayer stack, in which case between each pair of molybdenum sulfide sublayers, there is a thin metal intermediate film of a thickness of at most 0.3 μm or a film of a hard material, preferably one of those last mentioned.

The outer layer according to the invention can either be applied to a substrate body of a hard metal, cermet, ceramic or steel directly or to a substrate body which itself has been coated with a hard material. Especially it has been found to be advantageous to provide between the substrate body and the outermost layer in the latter case, at least three layers which can be formed substantially from carbides, nitrides, carbonitrides, oxycarbonitrides, oxides and/or borides of at least one of the elements from Group IVa to VIa of the Periodic Table, or of a ceramic, preferably $Al_2O_3$. The hard material coating of the substrate is itself known in the art and can be applied by means of plasma vapor deposition (PVD), chemical vapor deposition (CVD) or plasma-assisted chemical vapor deposition (PCVD). Preferably a CVD coating is selected since then in a single reactor in which the hard material coating is applied to the substrate, the outer layer of the invention can be coated onto the body. The total thickness of all layers should be less than 20 μm. A preferred layer sequence on the substrate body is TiN—Ti(C,N)—TiN onto which the outermost layer of the invention can be coated.

The body fabricated in accordance with the invention can be configured as a tool for a machining operation, for example, an insert which can be used on a lathe for turning operations or on a milling machine.

BRIEF DESCRIPTION OF THE DRAWING

The above and other objects, features, and advantages will become more readily apparent from the accompanying drawing, the sole FIGURE of which is a cross section through a cutting plate for a milling cutter or lathe cutter.

SPECIFIC DESCRIPTION AND EXAMPLES

The cutting plate shown in the drawing comprises a substrate 10 which can be composed, as will be apparent hereinafter, of tungsten carbide with 6% by weight of mixed carbides of titanium, tantalum and niobium.

This substrate is provided with the three layer coating described above with a first coating of TiN, a second coating of Ti(C,N) and a third coating of TiN as shown at 11, 12 and 13. The final or outermost coating 14 is of $MoS_2$ and 2.8 atomic % CL.

The formation of this last layer can be effected by a CVD process utilizing a gas mixture of molybdenum chloride, hydrogen sulfide, an inert gas like argon and hydrogen in which the volume proportion of hydrogen in the gas phase ranges between one volume % and 90 volume % and preferably between 2 volume % and 20% by volume.

Depending upon the composition of the gas mixture, the temperature and the pressure, the chlorine content in the molybdenum sulfide layer can be varied. The hydrogen proportion is maintained in the gas atmosphere and the molybdenum chloride is preferably $MoCl_5$.

Optimum reaction conditions are present when the CVD coating temperature is between 300° C. and 800° C. and/or when the pressure in the gas phase is between 0.1 kPa and 50 kPa.

According to a further feature of the invention the molar ratio between $H_2S$ and $MoCl_5$ in the gas phase lies between 30:1 and 900:1.

If a film is required for sealing the $MoS_2$ layer, that film preferably is composed of molybdenum and may be applied in a single layer or in a number of layers and the molybdenum and molybdenum sulfide may be deposited in alternating sequence with the $H_2S$ gas feed being briefly interrupted. Other metal sealing films, for example of tungsten or copper can also be applied by CVD. In this case the gas feed must be correspondingly altered.

The combination of the molybdenum sulfide layer as a sealing cover layer of a hard material or the production of a multilayer molybdenum sulfide coating with intermediate layers of hard material can also be obtained by CVD processes. The low cost of a molybdenum carbide layer, which only requires the supplying of an additional hydrocarbon gas, for example methane or acetylene, justifies this approach. Should hard material layers like carbides, nitrides or carbonitrides of other metals, especially the titanium carbide, titanium carbonitride and zirconium carbonitride, be applied, other reactive gas mixtures must be used. From an apparatus point of view this does not pose a problem since gas feeds in sufficient number are provided for such apparatus.

The combination of the sole or outer molybdenum sulfide layer with metal and/or hard material contributes a number of technological advantages which enable the product, especially a machining tool, to be used in an optimal manner in a variety of machining applications.

EXAMPLES

In a series of tests different substrate materials were coated in a heated quartz glass tube. These included uncoated cutting inserts as well as inserts previously coated with titanium nitride/titanium carbonitride/titanium nitride layer sequences as well as thin silicon disks for analytical study. The reactive gas mixture was generated by supplying argon over molybdenum pentachloride in a separate flask and then mixing the product with argon and hydrogen sulfide. The temperature in the quartz gas tube was available between 300° C. and 800° C. The pressure could be controlled between 0.1 and 50 kPa. For control of the flow rate, a flow meter was used. Respective atomic compositions of the produced single or outer layer was determined by wavelength dispersive X-ray spectroscopy. By X-ray diffraction studies of the deposited layers, the proportions in the solid phases of silicon $Mo_2S_3$ were determined. Especially high proportions (greater than 70 volume %) of hexagonal $MoS_2$ correlated with chlorine contents of 0.6 atomic %.

As has already been indicated, the $MoS_2$ coating for reduction of the friction forces had preferentially a hexagonal lattice structure. The hexagonal cross linking planes of the crystallites were parallel to the surface, i.e. axes of the hexagonal structures were normal to the surfaces as could be determined by X-ray diffraction measurements.

Especially with gas mixtures that contained about 90 to 95% $MoCl_5$, $H_2S$ and argon, the balance hydrogen, it was possible to obtain at 600° C. dense $MoS_2$ layers with a chlorine content between 1 and 3 atomic % with the aforementioned preferred orientation. When the chlorine content in the deposited molybdenum sulfide layer dropped below 0.5% or exceeded 6%, the suspension characteristics of the molybdenum sulfide layer was significantly poorer.

In a concrete example a gas mixture of 1.49 volume percent $H_2S$, 0.01 volume % $MoCl_5$, 14.8 volume % $H_2$ and 83.7 volume % argon was used for the coating operation. The $MoCl_5$ feed was effected by admitting to the tube a gas heated to 100° C. and formed by passing argon over $MoCl_5$. The volume ratio of $H_2S$ to $H_2$ in the coating chamber was maintained at 149:1. The temperature of coating was 500° C. and the pressure was 500 Pa. After a coating duration of 2 hours, a 0.9 μm thick $MoS_2$ layer was found to be formed.

The cutting plates or cutting inserts on which the coatings were applied were commercial cutting inserts of the type CNMG120412 which were comprised of a hard metal of the composition 6% Co, 8% (Ti,Ta,Nb)C, balance WC. The cutting inserts were coated with the layer sequence TiN, Ti(C,N) and TiN to a total thickness of 12 to 13 μm. A portion of the surface of the cutting plate was then additionally coated with about 2 μm thick $MoS_2$ as described with a chlorine content of 2.8 atomic % comparative tests between such coated cutting inserts and uncoated cutting inserts were made utilizing a lathe for a smooth cut.

For the cutting insert life test, a shaft of stainless steel X5CrNi 18 9 was used. With this kind of workpiece the thermal loading at the cutting edge is especially high. All of the turning tests were carried out dry with a cutting speed of 140 m/min, a cutting depth of 2.5 nm and a feed of 0.25 mm per revolution. At fixed time intervals the machining was interrupted and the average (VB) and the maximum ($Vb_{max}$) wear were measured. The results are shown in the following table:

| | Cutting inserts CNMG120412, coated with 12 μm TiN/Ti(C,N)/TiN | | | |
|---|---|---|---|---|
| | Without the Outer Layer of the Invention | | With the Outer Layer of the Invention | |
| Cutting Time in Minutes | VB mm | $Vb_{max}$ mm | VB mm | $Vb_{max}$ mm |
| 1 | 0.04 | 0.05 | 0.03 | 0.04 |
| 2 | 0.04 | 0.10 | 0.03 | 0.05 |
| 4 | 0.05 | 0.13 | 0.04 | 0.08 |
| 8 | 0.10 | 0.22 | 0.05 | 0.10 |
| 16 | 0.28 | 1.08*) | 0.08 | 0.15 |
| 32 | — | — | 0.11 | 0.23 |

*)Breakage, Test ended

As the foregoing test results show, by the application of the outer layer of the invention, the useful life of the cutting insert could be significantly increased. In part the life of the tool could be doubled or better. With the outer layer as described in the invention, a cutting insert useful life can be obtained which is equivalent to that which obtains when a liquid coolant or lubricant is used as a cutting liquid.

We claim:
1. A tool comprising:
 a substrate forming a tool body and composed of at least one material selected from the group which consists of hard metals, cermets, ceramics and steel; and
 a coating comprised of at least one layer on said substrate and including an outermost molybdenum sulfide layer, the outermost molybdenum sulfide layer being composed predominantly of molybdenum sulfide and containing chlorine in an amount of 0.5 to 6 atomic percent.
2. The tool defined in claim 1 wherein the molybdenum sulfide in said outermost molybdenum sulfide layer has a hexagonal lattice structure with a preferred orientation of axes of the lattice hexagons normal to a surface of said outermost molybdenum sulfide layer.
3. The tool defined in claim 1 wherein said outermost molybdenum sulfide layer is composed of at least 70% by volume of molybdenum sulfide with said hexagonal lattice structure, the balance being selected from the group which consists of rhombohedral molybdenum sulfide, $Mo_2S_3$ and mixtures thereof.
4. The tool defined in claim 1 wherein said outermost molybdenum sulfide layer has a thickness of 0.2 to 3 μm.
5. The tool defined in claim 1 wherein said outermost molybdenum sulfide layer has a metallic sealing layer of a thickness of at most 0.3 μm applied thereto.
6. The tool defined in claim 5 wherein said metallic layer is composed of at least one substance selected from the group which consists of molybdenum, molybdenum carbide, titanium carbonitride, titanium carbide and zirconium carbonitride.
7. The tool defined in claim 1 wherein said outermost molybdenum sulfide layer is a multilayer composite having at least one thin layer between molybdenum sulfide layers thereof, the thin layer having a thickness of at most 0.3 μm and being composed of at least one substance selected from the group which consists of molybdenum, molybdenum carbide, titanium carbonitride, titanium carbide and zirconium carbonitride.
8. The tool defined in claim 1 wherein said tool has, between said substrate and said outermost molybdenum sulfide layer, a plurality of other layers each composed of at least one substance selected from the group which consists of the carbides, nitrides, carbonitrides, oxycarbonitrides, oxides and borides of an element from Groups IVa to VIa of the Periodic Table, and a ceramic.
9. The tool defined in claim 8 wherein said ceramic is $Al_2O_3$.
10. The tool defined in claim 8 wherein all of the layers on said substrate have a collective thickness less than 20 μm.
11. The tool defined in claim 1 wherein said coating consists of a layer sequence TiN—Ti(C,N)—TiN between said substrate and said outermost molybdenum layer.
12. The tool defined in claim 1 configured as a cutting tool for the machining of metal workpieces.
13. The tool defined in claim 1 wherein said outermost molybdenum layer contains 0.5 to 3 atomic percent chlorine.
14. The tool defined in claim 1, further comprising a sealing layer of a thickness of at most 0.3 μm on said outermost molybdenum sulfide layer and consisting of at least one substance selected from the group which consists of molybdenum carbide, titanium carbonitride, titanium carbide and zirconium carbonitride.

* * * * *